(12) United States Patent
Kim

(10) Patent No.: US 7,702,701 B2
(45) Date of Patent: Apr. 20, 2010

(54) LOW-POWER RANDOM BIT GENERATOR USING THERMAL NOISE AND METHOD THEREOF

(75) Inventor: Cheol-Min Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1089 days.

(21) Appl. No.: 11/362,633

(22) Filed: Feb. 27, 2006

(65) Prior Publication Data

US 2007/0011217 A1 Jan. 11, 2007

(30) Foreign Application Priority Data

Jul. 6, 2005 (KR) ...................... 10-2005-0060940

(51) Int. Cl.
*G06J 1/00* (2006.01)
*G06F 7/58* (2006.01)

(52) U.S. Cl. .......................................... 708/3; 708/255
(58) Field of Classification Search ..................... 708/3, 708/255
See application file for complete search history.

(56) References Cited

U.S. PATENT DOCUMENTS

| 4,176,399 | A | * | 11/1979 | Hoffmann et al. | ........... 708/250 |
|---|---|---|---|---|---|
| 4,355,366 | A | * | 10/1982 | Porter | ........................ 708/255 |
| 4,545,024 | A | * | 10/1985 | Maher et al. | ................. 708/255 |
| 6,061,702 | A | * | 5/2000 | Hoffman | ..................... 708/251 |
| 6,070,178 | A | * | 5/2000 | Anderson et al. | ............... 708/3 |
| 6,571,263 | B1 | * | 5/2003 | Nagai | ............................ 708/3 |
| 7,099,906 | B2 | * | 8/2006 | Messina et al. | ............. 708/255 |

FOREIGN PATENT DOCUMENTS

| JP | 20040280486 | 10/2004 |
|---|---|---|
| KR | 20020020989 | 3/2002 |
| KR | 20040085608 | 10/2004 |
| KR | 1020040085608 A | 10/2004 |

* cited by examiner

*Primary Examiner*—Tan V Mai
(74) *Attorney, Agent, or Firm*—Chau & Associates, LLC

(57) ABSTRACT

A random bit generator and a method thereof are provided. The random bit generator includes an amplifier, a comparing circuit, an oscillator, a sampler, and a storage circuit. The amplifier amplifies a difference between input signals generated based on thermal noise. The comparing circuit compares an alternating current (AC) signal output from the amplifier with a direct current (DC) signal obtained by low-pass filtering the AC signal and outputs a signal according to the comparison result. The oscillator may be implemented with a resistor-capacitor (R-C) oscillator. The oscillator consumes lower current and occupies a smaller layout area than a voltage controlled oscillator (VCO) and outputs an oscillation signal. The sampler samples the oscillation signal output from the oscillator in response to the output signal of the comparing circuit. The storage circuit stores an output signal of the sampler in response to a clock signal.

4 Claims, 2 Drawing Sheets

LOW-POWER RANDOM BIT GENERATOR USING THERMAL NOISE AND METHOD THEREOF

CROSS-REFERENCE TO RELATED PATENT APPLICATIONS

This application claims the benefit of Korean Patent Application No. 10-2005-0060940 filed on Jul. 6, 2005, in the Korean Intellectual Property Office, the disclosure of which is incorporated herein by reference.

BACKGROUND OF THE INVENTION

1. Field of the Invention

The present invention relates to a random bit generator and a method thereof, and more particularly, to a low-power random bit generator and a method thereof.

2. Description of the Related Art

With the increasing importance of information security, the importance of a random number generator (RNG) generating a key used for encryption and decryption also increases. The RNG includes a random bit generator (RBG) for generating a random bit and a post-processor for increasing the randomness of the random bit generated by the random bit generator.

When the RNG is installed in a mobile system such as a smart card, it is desirable for the operating current of the RNG to be low and the layout area of the RNG on a chip to be small. Accordingly, it is desired to provide an RNG circuit having a simple structure and a small layout area with a low operating current, as well as an included random bit generator.

SUMMARY OF THE INVENTION

According to an aspect of the present invention, there is provided a random bit generator including an amplifier amplifying a difference between thermal noise received from a first resistor connected to a first input terminal of the amplifier and thermal noise received from a second resistor connected to a second input terminal of the amplifier and outputting an amplification result through an output terminal of the amplifier, a comparing circuit which is connected to the output terminal of the amplifier, compares an output signal of the amplifier with a signal obtained by filtering the output signal of the amplifier, and outputs a comparison result, an oscillator outputting an oscillation signal, a sampler sampling the oscillation signal output from the oscillator in response to an output signal of the comparing circuit, and a storage circuit storing an output signal of the sampler in response to a clock signal.

According to another aspect of the present invention, there is provided a method of generating a random bit. The method includes amplifying a difference between thermal noise received from a first resistor connected to a first input terminal and thermal noise received from a second resistor connected to a second input terminal and outputting an amplification result, comparing the amplification result with a signal obtained by low-pass filtering the amplification result and outputting a comparison result, sampling an oscillation signal with a predetermined jitter, in response to the comparison result, and storing the sampled oscillation signal in response to a clock signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF PREFERRED EMBODIMENTS

Figure 1:
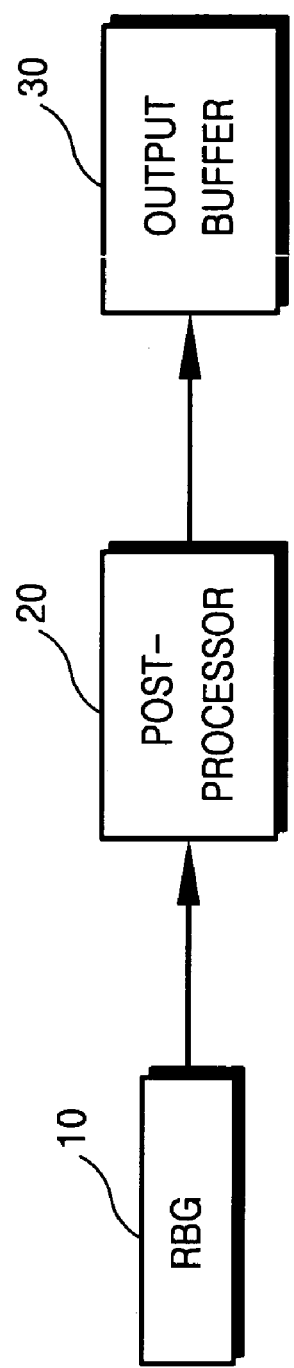
FIG. 1 is a block diagram of a random number generator including a random bit generator according to an embodiment of the present invention.

Hereinafter, the present invention will be described in detail by explaining preferred embodiments of the invention with reference to the attached drawings. Like reference numerals in the drawings denote like elements.

FIG. 1 is a block diagram of a random number generator including a random bit generator according to an embodiment of the present invention. Referring to FIG. 1, the random number generator (RNG) includes the random bit generator (RBG) 10, a post-processor 20, and an output buffer 30.

The RBG 10 generates a random bit from thermal noises of resistors. The post-processor 20 receives a random bit generated by the RBG 10 and processes algorithms such as a correction algorithm and a compression algorithm in digital mode, thereby increasing the randomness of the random bit. The output buffer 30 receives and buffers an output signal of the post-processor 20.

Figure 2:
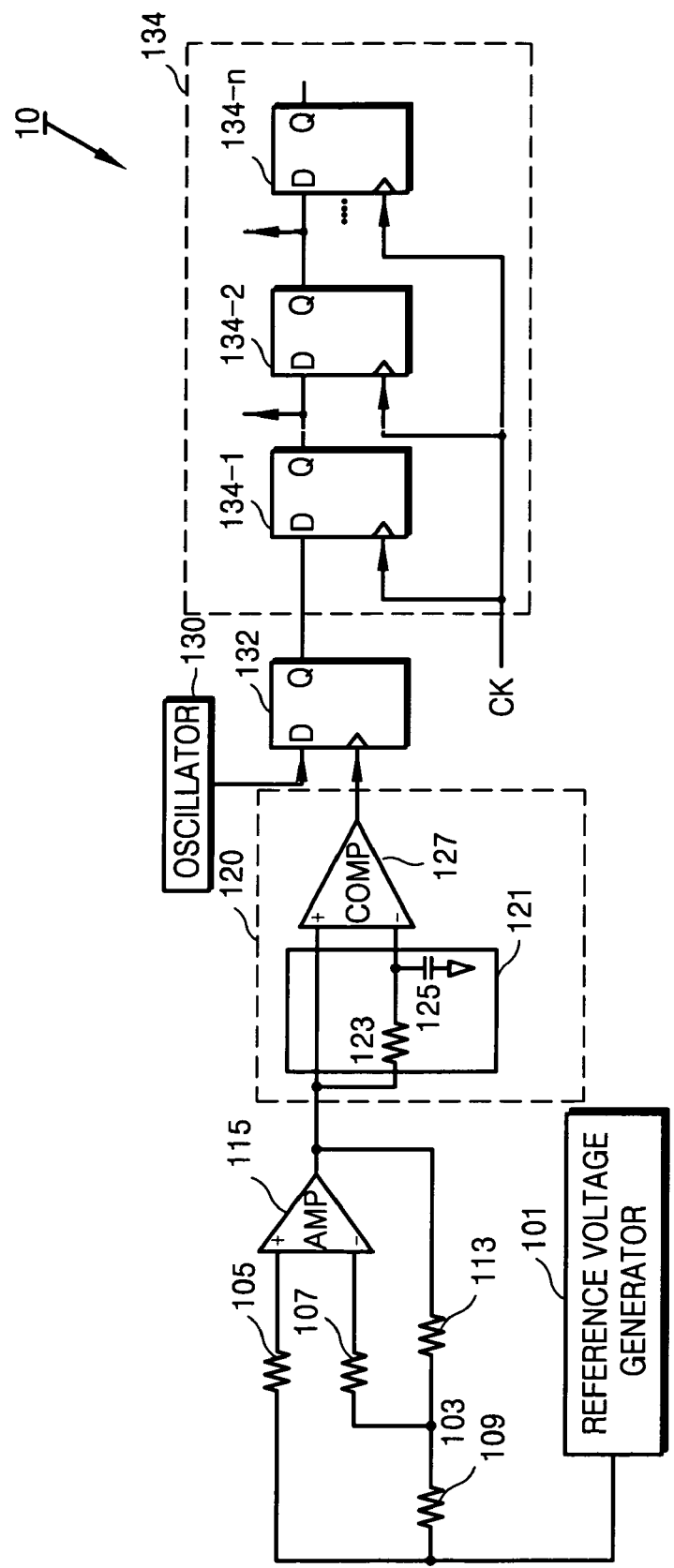
FIG. 2 is a circuit diagram of the random bit generator according to the embodiment illustrated in FIG. 1.

FIG. 2 is a circuit diagram of the random bit generator according to the embodiment illustrated in FIG. 1. The RBG 10 may be installed in a mobile system such as a smart card.

Referring to FIG. 2, the RBG 10 includes a reference voltage generator 101, first, second, third and fourth resistors 105, 107, 109, and 113, an amplifier 115, a comparing circuit 120, an oscillator 130, a sampler 132, and a storage circuit 134.

The reference voltage generator 101 generates a predetermined reference voltage. The reference voltage may be half of a power supply voltage but is not restricted thereto.

The first resistor 105 is connected between an output terminal of the reference voltage generator 101 and a first input terminal (+) of the amplifier 115 and generates thermal noise. The second resistor 107 is connected between a node 103 and a second input terminal (−) of the amplifier 115 and generates thermal noise. The third resistor 109 is connected between the output terminal of the reference voltage generator 101 and the node 103. The fourth resistor 113 is connected between the node 103 and an output terminal of the amplifier 115. The third and fourth resistors 109 and 113 are used as feedback resistors.

The amplifier 115 amplifies a difference between thermal noise received from the first resistor 105 and thermal noise received from the second resistor 107 and outputs an amplification result to the comparing circuit 120.

The comparing circuit 120 includes a low-pass filter 121 and a comparator 127. The low-pass filter 121 includes a fifth resistor 123 and a capacitor 125. The comparator 127 receives an output signal of the amplifier 115 through a first input terminal (+) of the comparator, i.e., an alternating current (AC) signal, and an output signal of the low-pass filter 121 through a second input terminal (−) of the comparator, i.e., a direct current (DC) signal, compares the AC signal with the DC signal, and outputs a signal including a predetermined jitter according to a comparison result.

The oscillator 130 may be an R-C oscillator including a resistor (R) and a capacitor (C). The R-C oscillator 130 consumes less current and occupies a smaller layout area than a voltage controlled oscillator (VCO) and outputs an oscillation signal including 10% through 20% jitter. The R-C oscillator 130 has randomness due to its own noise and thus has an effect of increasing entropy. In other words, since the amplifier 115 amplifying thermal noises of resistors and the R-C oscillator 130 are separate circuits without correlation, entropy is increased by the RBG 10. Accordingly, the R-C oscillator 130 is appropriate to a chip used for a mobile system such as a smart card where low-power consumption and small size is desired.

The sampler 132 samples the oscillation signal of the R-C oscillator 130 in response to the output signal of the comparator 127. In other words, the sampler 132 samples an output signal of the oscillator 130 using the output signal of the comparator 127 as a sampling clock. The sampler 132 may be implemented with a flip-flop.

The storage circuit 134 receives an output signal of the sampler 132 in response to a clock signal CK and stores the output signal of the sampler 132. The storage circuit 134 includes a plurality of unit storage circuits 134-1 through 134-n, where "n" is an integer. Each of the unit storage circuits 134-1 through 134-n may be implemented with a shift register. Accordingly, each of the unit storage circuits 134-1 through 134-n outputs data in response to the clock signal CK.

As described above, according to at least one embodiment of the present invention, a low-power RBG using thermal noise occupies a smaller layout area and consumes less current than a conventional RBG using a VOC.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A random bit generator comprising:
    an amplifier amplifying a difference between thermal noise received from a first resistor connected to a first input terminal of the amplifier and thermal noise received from a second resistor connected to a second input terminal of the amplifier and outputting an amplification result through an output terminal of the amplifier;
    a comparing circuit comparing an output signal of the amplifier with a signal obtained by filtering the output signal of the amplifier and outputting a comparison result;
    an oscillator outputting an oscillation signal;
    a sampler sampling the oscillation signal output from the oscillator in response to an output signal of the comparing circuit;
    a storage circuit storing an output signal of the sampler in response to a clock signal;
    a reference voltage generator generating a reference voltage;
    a node;
    a third resistor connected between an output terminal of the reference voltage generator and the node; and
    a fourth resistor connected between the node and the output terminal of the amplifier,
    wherein the first resistor is connected between the output terminal of the reference voltage generator and the first input terminal of the amplifier, and the second resistor is connected between the output terminal of the reference voltage generator and the node, and
    wherein the oscillator generates the oscillation signal having a predetermined jitter.

2. The random bit generator of claim 1, wherein the comparing circuit comprises:
    a comparator having a first input terminal connected to the output terminal of the amplifier, a second input terminal, and an output terminal; and
    a low-pass filter connected between the output terminal of the amplifier and the second input terminal of the comparator.

3. The random bit generator of claim 1, wherein the oscillator is a resistor-capacitor circuit.

4. A method of generating a random bit, comprising:
    amplifying a difference between thermal noise received from a first resistor connected to a first input terminal and thermal noise received from a second resistor connected to a second input terminal and outputting an amplification result;
    feeding back the amplification result through a third resistor connected to the first resistor and through a fourth resistor connected to the second resistor;
    comparing the amplification result with a signal obtained by low-pass filtering the amplification result and outputting a comparison result;
    sampling an oscillation signal with having a predetermined jitter, in response to the comparison result; and
    storing the sampled oscillation signal in response to a clock signal.

* * * * *